US007616383B2

(12) United States Patent
Streefkerk et al.

(10) Patent No.: US 7,616,383 B2
(45) Date of Patent: Nov. 10, 2009

(54) LITHOGRAPHIC APPARATUS AND DEVICE MANUFACTURING METHOD

(75) Inventors: Bob Streefkerk, Tilburg (NL); Sjoerd Nicolaas Lambertus Donders, 's-Hertogenbosch (NL); Erik Roelof Loopstra, Heeze (NL); Johannes Catharinus Hubertus Mulkens, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/847,661

(22) Filed: May 18, 2004

(65) Prior Publication Data

US 2005/0259232 A1 Nov. 24, 2005

(51) Int. Cl.
*G02B 3/12* (2006.01)
(52) U.S. Cl. .......................... 359/665; 355/53; 355/30; 430/311
(58) Field of Classification Search .................. None
See application file for complete search history.

(56) References Cited

U.S. PATENT DOCUMENTS

| | | | |
|---|---|---|---|
| 3,573,975 A | 4/1971 | Dhaka et al. ............... 117/212 |
| 3,648,587 A | 3/1972 | Stevens ........................ 95/44 |
| 4,346,164 A | 8/1982 | Tabarelli et al. ............ 430/311 |
| 4,390,273 A | 6/1983 | Loebach et al. ............ 355/125 |
| 4,396,705 A | 8/1983 | Akeyama et al. ........... 430/326 |
| 4,480,910 A | 11/1984 | Takanashi et al. ........... 355/30 |
| 4,509,852 A | 4/1985 | Tabarelli et al. ............. 355/30 |
| 5,040,020 A | 8/1991 | Rauschenbach et al. ...... 355/53 |
| 5,610,683 A | 3/1997 | Takahashi ................... 355/53 |
| 5,715,039 A | 2/1998 | Fukuda et al. ............... 355/53 |
| 5,825,043 A | 10/1998 | Suwa ......................... 250/548 |
| 5,900,354 A | 5/1999 | Batchelder ................ 430/395 |
| 6,073,369 A * | 6/2000 | Yasuyuki ..................... 34/651 |
| 6,191,429 B1 | 2/2001 | Suwa ......................... 250/548 |
| 6,236,634 B1 | 5/2001 | Lee et al. ................... 369/112 |
| 6,560,032 B2 | 5/2003 | Hatano ....................... 359/656 |
| 6,600,547 B2 | 7/2003 | Watson et al. |
| 6,603,130 B1 | 8/2003 | Bisschops et al. ........ 250/492.1 |
| 6,633,365 B2 | 10/2003 | Suenaga ....................... 355/53 |
| 6,844,027 B1 * | 1/2005 | Gurer et al. ................. 427/240 |
| 6,952,253 B2 * | 10/2005 | Lof et al. ..................... 355/30 |
| 2001/0015021 A1 * | 8/2001 | Gommori et al. ............. 34/492 |
| 2002/0020821 A1 | 2/2002 | Van Santen et al. ......... 250/492 |
| 2002/0163629 A1 | 11/2002 | Switkes et al. ............... 355/53 |
| 2003/0011763 A1 | 1/2003 | Taniguchi et al. |
| 2003/0030916 A1 | 2/2003 | Suenaga |
| 2003/0123040 A1 | 7/2003 | Almogy ....................... 355/69 |
| 2003/0174408 A1 | 9/2003 | Rostalski et al. ............ 359/642 |
| 2004/0000627 A1 | 1/2004 | Schuster |
| 2004/0021844 A1 | 2/2004 | Suenaga |
| 2004/0075895 A1 | 4/2004 | Lin .............................. 359/380 |
| 2004/0109237 A1 | 6/2004 | Epple et al. |
| 2004/0118184 A1 | 6/2004 | Violette |
| 2004/0119954 A1 | 6/2004 | Kawashima et al. ........... 355/30 |
| 2004/0125351 A1 | 7/2004 | Krautschik .................... 355/53 |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0241996 A1 * | 12/2004 | Hung et al. ................. 438/689 |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0007569 A1 | 1/2005 | Streefkerk et al. |
| 2005/0024609 A1 | 2/2005 | De Smit et al. |
| 2005/0030506 A1 | 2/2005 | Schuster |
| 2005/0036121 A1 | 2/2005 | Hoogendam |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |

(Continued)

FOREIGN PATENT DOCUMENTS

DE 206 207 2/1984

(Continued)

OTHER PUBLICATIONS

M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSCM, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.

(Continued)

*Primary Examiner*—John A McPherson
*Assistant Examiner*—Daborah Chacko Davis
(74) *Attorney, Agent, or Firm*—Pillsbury Winthrop Shaw Pittman LLP

(57) ABSTRACT

A lithographic projection apparatus is disclosed in which a liquid supply system provides a liquid between the projection system and the substrate. An active drying station is provided to actively remove the liquid from the substrate W or other objects after immersion of all or part of a surface of the substrate W or other objects.

37 Claims, 4 Drawing Sheets

U.S. PATENT DOCUMENTS

| | | | |
|---|---|---|---|
| 2005/0046934 A1* | 3/2005 | Ho et al. ............... 359/380 |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225735 A1 | 10/2005 | Magome et al. |
| 2005/0225737 A1 | 10/2005 | Weissenrieder et al. |
| 2005/0231694 A1 | 10/2005 | Kolesnychenko et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259233 A1 | 11/2005 | Streefkerk et al. |
| 2005/0270505 A1 | 12/2005 | Smith |
| 2006/0023185 A1* | 2/2006 | Hazelton et al. ............ 355/53 |
| 2006/0119816 A1 | 6/2006 | Baselmans et al. |
| 2007/0064210 A1 | 3/2007 | Kobayashi et al. |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0 605 103 A1 | 7/1994 |
| EP | 1039511 | 9/2000 |
| EP | 1 420 299 A2 | 5/2004 |
| EP | 1 670 039 A1 | 6/2006 |
| EP | 1 672 682 A1 | 6/2006 |
| FR | 2474708 | 7/1981 |
| JP | 57-153433 | 9/1982 |
| JP | 58-202448 | 11/1983 |
| JP | 59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 05-62877 | 3/1993 |
| JP | 06-124873 | 5/1994 |
| JP | 06-168866 A | 6/1994 |
| JP | 07-132262 | 5/1995 |
| JP | 07-220990 | 8/1995 |
| JP | 08-316125 | 11/1996 |
| JP | 09-283401 A | 10/1997 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2001-227868 A | 8/2001 |
| JP | 2002-016124 A | 1/2002 |
| JP | 2004/019128 | 3/2004 |
| JP | 2004-193252 | 7/2004 |
| JP | 2005-086030 A | 3/2005 |
| JP | 2005-183656 A | 7/2005 |
| JP | 2005-197469 A | 7/2005 |
| WO | WO 99/49504 | 9/1999 |
| WO | 11-283903 | 10/1999 |
| WO | WO 02/091078 A1 | 11/2002 |
| WO | WO 03/077036 | 9/2003 |
| WO | WO 03/077037 | 9/2003 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/102646 | 11/2004 |
| WO | WO 2004/105107 A1 | 12/2004 |
| WO | WO 2005/001432 A2 | 1/2005 |
| WO | WO 2005/003864 A2 | 1/2005 |
| WO | WO 2005/006028 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/022616 A1 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005-036621 A1 | 4/2005 |
| WO | WO 2005/036623 A1 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/059817 A2 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |

| | | |
|---|---|---|
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |

OTHER PUBLICATIONS

G.W.W. Stevens, "Reduction of Waste Resulting from Mask Defects", Solid State Technology, Aug. 1978, vol. 21 008, pp. 68-72.

S. Owa et al., "Immersion Lithography: its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9(1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2µm Fine Patterns Using Optical Projection Lithography with an Oil Immersion Lens", Jpn. J. Appl. Phys. vol. 31 (1992), pp. 4174-4177.

G. Owen et al., "1/µm Optical Lithography", J. Vac. Sci. Technol. B., vol. 10, No, 6, Nov./Dec. 1992, pp. 3032-3036.

H. Hogan, "New Semiconductor Lithography Makes a Splash", Photonics Spectra, Photonics TechnologyWorld, Oct. 2003 Edition, pgs. 1-3.

S. Owa and N. Nagasaka, "Potential Performance and Feasibility of Immersion Lithopraphy" NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar., 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial VNA scaling equations for resolution, depth of focus, and immersion lithography, *J. Microlith., Microfab., Microsyst.* 1(1):7-12 (2002).

European Office Action issued in EP 05 252 882.5 dated Dec. 18, 2006.

Emerging Lithographic Technologies VI, Proceedings of SPIE, vol. 4688 (2002), "Semiconductor Foundry, Lithography, and Partners", B.J. Lin, pp. 11-24.

Optical Microlithography XV, Proceedings of SPIE, vol. 4691 (2002), "Resolution Enhancement of 157 nm Lithography by Liquid Immersion", M. Switkes et al., pp. 459- 465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Information Disclosure Statement of U.S. Appl. No. 11/603,078, dated Nov. 22, 2006.

International Search Report of PCT Application PCT/JP2004/007417, dated Aug. 30, 2004.

\* cited by examiner

US 7,616,383 B2

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application publication WO 99/49504, hereby incorporated in its entirety by reference. As illustrated in FIGS. 6 and 7, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 6 shows the arrangement schematically in which liquid is supplied via inlet IN and is taken up on the other side of the element by outlet OUT which is connected to a low pressure source. In the illustration of FIG. 6 the liquid is supplied along the direction of movement of the substrate relative to the final element, though this does not need to be the case. Various orientations and numbers of in- and out-lets positioned around the final element are possible, one example is illustrated in FIG. 7 in which four sets of an inlet with an outlet on either side are provided in a regular pattern around the final element.

Clearly the presence of liquid in the immersion lithographic projection apparatus raises difficulties not present in conventional lithographic apparatus. For example, sensors such as interferometers for measuring the position of a substrate table which supports the substrate can be influenced by humidity present due to immersion liquid. Furthermore, not all of the solutions described herein for the liquid supply system may be perfect at containing all of the immersion liquid and some seepage or spillage may occur.

SUMMARY

Accordingly, it would be advantageous, for example, to reduce problems associated with the presence of immersion liquid in a lithographic projection apparatus.

According to an aspect, there is provided a lithographic apparatus comprising:
  an illumination system adapted to condition a beam of radiation;
  a support structure configured to hold a patterning device, the patterning device configured to impart the beam with a pattern in its cross-section;
  a substrate table configured to hold a substrate;
  a projection system adapted to project the patterned beam onto a target portion of the substrate;
  a liquid supply system configured to at least partly fill a space between the projection system and an object on the substrate table with a liquid; and
  an active drying station configured to actively remove the liquid from the object, the substrate table, or both.

Active removal of immersion liquid (which is, in an embodiment, accomplished without substantial heating of the substrate) may ensure that immersion liquid is in contact with the resist on the substrate (if the substrate is the object) for as short a time as possible. This is important because the immersion liquid may react with the resist so that the quality of the image on the substrate can change according to the amount of time that the resist is in contact with immersion liquid. Furthermore, if an active drying station removes liquid from a sensor the performance of that sensor may be enhanced. Removing liquid from an object and/or the substrate table may reduce contamination of the atmosphere in the apparatus with liquid vapor. This may enhance the performance of any optical sensors which may be present in the apparatus. The active removal generally takes place after the object and/or substrate table is moved from under the projection system and/or removed from the liquid supply system i.e. after the supply of liquid to the object and/or substrate table is stopped.

In an embodiment, the substrate table transports the object to the active drying station and supports the object during active removal of liquid from the object by the active drying station. This may ensure that the active removal of liquid takes place as soon as possible after removal from under the projection system (or from the liquid supply system) thereby reducing the amount of time that liquid is exposed to the atmosphere of the apparatus and to the resist on the substrate; the substrate does not need to be removed from the substrate table before it is dried.

The active drying station may be positioned between the projection system and a substrate post exposure processing module so that the removal of liquid can take place between the exposure position and the post exposure processing module or in the case of a substrate table mounted sensor, just before measurement using the sensor. That is the active drying station is within and/or part of the projection apparatus and not the post exposure processing module.

In an embodiment, the drying station comprises gas flow device to provide a flow of gas over a surface of the object and/or the substrate table. In an embodiment, the gas flow device can provide a flow of gas of at least 50 liters per minute. This may ensure that the humidity inside the lithographic apparatus remains low and can help in keeping the apparatus stable in terms of temperature fluctuations, for example. The active drying station may comprise a gas inlet configured to provide gas onto a surface of the object and/or substrate table and/or a gas outlet configured to remove gas and/or liquid from the surface of the object and/or substrate table. In the case of a gas inlet, the gas inlet may comprise a gas knife or a gas shower with at least ten inlets. Both of those solutions have been found to be particularly effective at removing liquid from the surface of the object and/or the substrate table.

The active drying station may comprise a spinner configured to spin the object and/or substrate table. The spinner makes use of centrifugal forces to remove liquid from the object and/or substrate table. This solution may be particularly suitable for when the object is the substrate in which case the substrate is spun in its major plane around its center.

Another alternative which may be used by itself or in addition to any of the other measures discussed above, wherein the liquid between the projection system and an object on the substrate table is a first liquid, comprises a first liquid dissolving liquid supply device configured to provide a second liquid, in which the first liquid dissolves, to a surface of the object. In this way the first liquid can be dissolved in the second liquid. The second liquid itself is chosen for easy removal from the substrate. This may be effected, for example, by choosing a second liquid which has wetting properties of the surface of the object and/or substrate table which promote drying. Alternatively or additionally, the second liquid may be chosen to be more volatile than the first liquid such that it easily evaporates off of the surface of the object and/or substrate table. In an embodiment, the second liquid is a ketone or an alcohol.

According to a further aspect, there is provided a device manufacturing method comprising:

providing a liquid between a projection system and an object on the substrate table;

projecting a patterned beam of radiation, through the liquid, onto a target portion of a substrate using the projection system; and actively removing the liquid from the object, the substrate table, or both.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
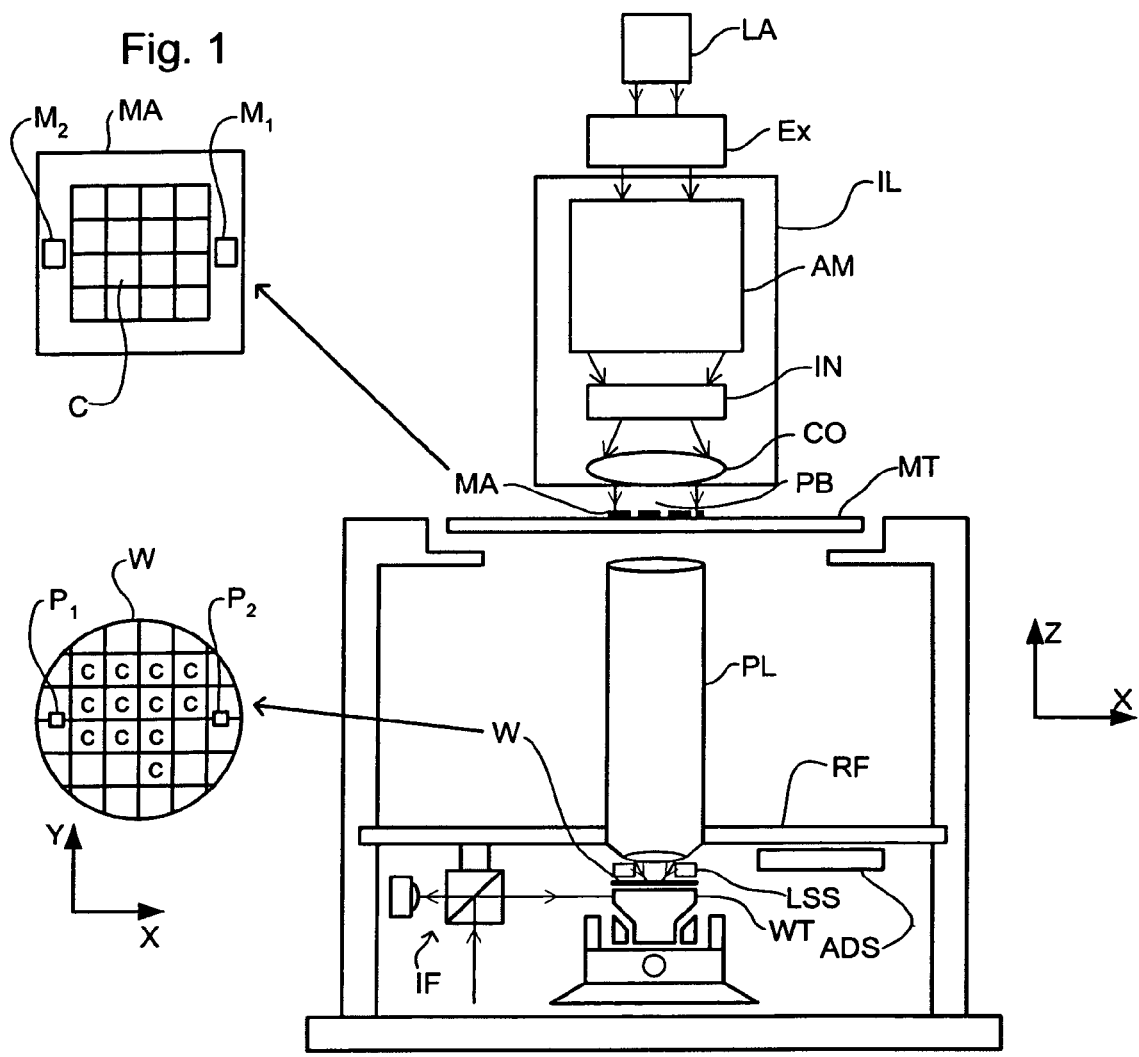
FIG. 1 depicts a lithographic apparatus according to an embodiment of the invention.

FIG. 1 schematically depicts a lithographic apparatus according to a particular embodiment of the invention. The apparatus comprises:

- an illumination system (illuminator) IL for providing a projection beam PB of radiation (e.g. UV radiation).
- a first support structure (e.g. a mask table) MT for supporting a patterning device (e.g. a mask) MA and connected to a first positioner for accurately positioning the patterning device with respect to item PL;
- a substrate table (e.g. a wafer table) WT for holding a substrate (e.g. a resist-coated wafer) W and connected to a second positioner for accurately positioning the substrate with respect to item PL; and
- a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the first and/or second positioners. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de−) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

According to an embodiment, the lithographic apparatus is provided with at least one active drying station ADS. In an embodiment, the active drying station ADS is positioned as close as possible to the projection system PL and the liquid supply system LSS which is positioned under the projection system PL. By active drying it is meant that positive measures are taken to remove liquid from an object rather than just performing normal operations on the object during which liquid may evaporate or run off naturally and not applying any measures to the object with the specific aim of drying the object. The liquid supply system LSS may be of any type including a localized area liquid supply system which provides liquid to a localized area on a surface of the substrate as well as to baths in which the whole of the substrate is immersed, etc.

When the substrate W is first moved from under the projection system PL away from the liquid supply system LSS (for example when it is lifted out of a liquid supply system in the form of a bath or when water is drained from that bath) the substrate is taken to the active drying station ADS. At the active drying station ADS immersion liquid which remains on the substrate W is actively removed by one or a combination of the measures described below. The resist (radiation sensitive coating on the substrate) is not affected or removed by the active drying station ADS.

Although the active drying station ADS will be described in relation to removing liquid from the substrate W, the active drying station may also be used for removing immersion liquid from sensors (which may be positioned on the substrate table WT and whose performance will be enhanced by removal of liquid) as well as from the substrate table itself. It may be used to remove liquid from other objects too. In the case of sensors, the liquid can be advantageously removed prior to measurement i.e. before exposure of the substrate W.

After having immersion liquid supplied to the substrate W, it is rarely possible to remove all remaining immersion liquid from the surface of the substrate before processing. Unfortunately immersion liquid can dissolve into resist on the substrate as well as the resist dissolving into the immersion liquid. Therefore, it is desirable, with the aim of uniform development of the substrate, to remove the remaining immersion liquid as soon as possible. This is done in the active drying station ADS. The active drying station ADS is, in an embodiment, positioned such that the substrate can be dried within a predetermined time after exposure of the substrate. The predetermined time is, in one or more implementations, less than 5 seconds, less than 2 seconds or less than 1 second. Furthermore, it is disadvantageous for the humidity in the apparatus to be high so that it is advantageous to remove immersion liquid remaining on the substrate table and sensors etc. as soon as possible as well. All of these functions can be performed by the active drying station ADS, in an embodiment, positioned in and/or part of the lithographic projection apparatus. Removal of remaining liquid from the sensors means that liquid cannot disturb proper leveling of the subsequent substrate, which may be a problem.

Although not depicted in FIG. 1, the active drying station ADS may be provided with a baffle or other suitable means to fully enclose the object as it is being dried. For example, the whole of the top surface of the substrate table WT may be enclosed with a curtain or baffle in the active drying station ADS to substantially prevent the spread of immersion liquid around the apparatus. A tray could be used to catch any drips.

Although the active drying station ADS has been illustrated in FIG. 1 as being part of the lithographic apparatus, this is not necessarily the case, and the active drying station ADS may be positioned anywhere between the position at which the substrate W is exposed to the projection beam PB and before a substrate post exposure processing module at which various processing steps such as baking of the resist, development and/or etching are performed. The active drying station may therefore be external of the lithographic projection apparatus.

The active drying station ADS can make use of any means to remove liquid from the substrate W. In an embodiment, the drying is achieved without substantial heating of the substrate W as this could unbalance the apparatus due to the generation of thermal gradients. Several examples of the way in and devices by which the active drying station ADS removes liquid from the substrate W are described below. These methods and/or devices may be used singly or in combination, either at the same time or one after another, as is appropriate.

In an embodiment, the active drying station ADS is positioned within the lithographic projection apparatus and the substrate table WT transports the substrate (or other object) which is to be dried to the active drying station ADS and supports the object (e.g., substrate, sensor, etc.) during active removal of immersion liquid from the object by the active drying station ADS. There may be a plurality of active drying stations, for example, one for the substrate W and one for the sensor(s) on the substrate table WT.

In its simplest form, the active drying station ADS comprises a gas flow device 10 to provide a flow of gas over the surface of the substrate W. The higher the flow of gas the more effective and quick is the removal of immersion liquid from the substrate W. In an embodiment, a flow rate of gas of at least 50 liters per minute, in an implementation, at least 100 liters per minute is achievable. In an embodiment, the gas is filtered and/or dried prior to being provided onto the substrate W to avoid contamination of the surface of the substrate W if this is compatible with the resist (which is not the case for some resists used for 248 nm radiation).

Figure 2:
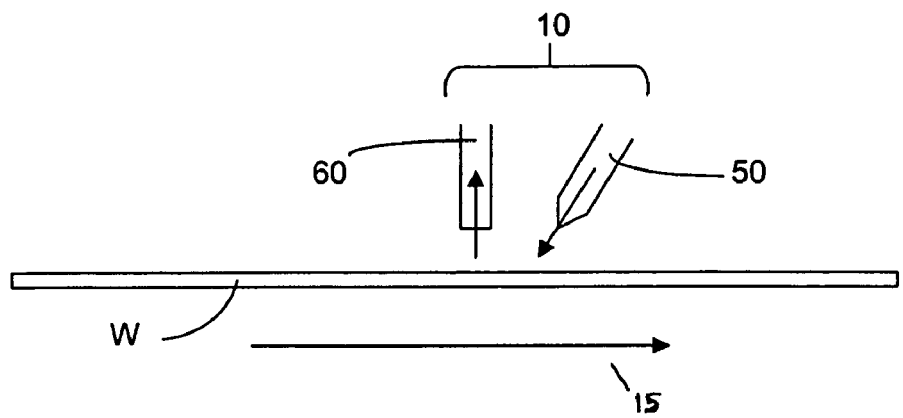
FIG. 2 illustrates an embodiment of the active drying station in which a gas knife is employed.

In the embodiment illustrated in FIG. 2, the gas flow device comprises an inlet 50 and an outlet 60. Gas under pressure is provided through inlet 50 and removed by an under pressure in outlet 60. The arrangement illustrated in FIG. 2 is a so-called gas knife in which the inlet 50 is a nozzle which accelerates the gas towards the substrate W so that it impinges on the substrate at both a high flow rate and a high velocity. In an embodiment, the gas jet impinges on the substrate at an acute angle to the substrate W in a direction towards the outlet 60. Such an arrangement is particularly effective at removing liquid from the surface of the substrate W. The gas flow device 10 may comprise only a single inlet 50 or a single outlet 60 or may comprise a plurality of in and outlets 50, 60. The substrate W may be moved under stationary in and outlet(s) 50, 60 as indicated by arrow 15. The in and outlets 50, 60 may also be a continuous groove as well as discrete in and outlet ports. The in and outlets 50, 60 may also be moveable.

It is also possible for the gas flow device only to comprise an outlet 60 which is connected to an under pressure. In this case gas as well as immersion liquid on top of the substrate W will be sucked up through the outlet 60.

Figure 3:
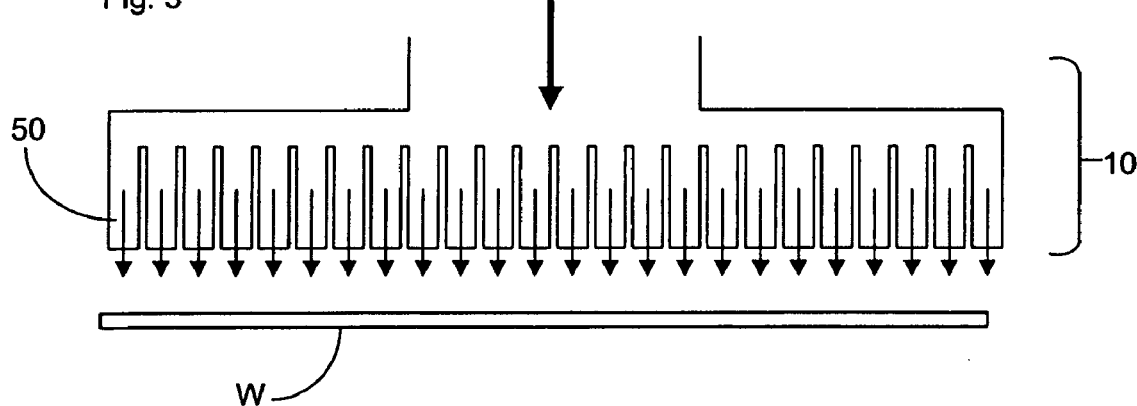
FIG. 3 illustrates an embodiment of the active drying station in which a gas shower is employed.

A further embodiment is illustrated in FIG. 3 in which the gas flow device 10 comprises a plurality of inlets 50 and no outlets above the substrate (although outlets may need to be provided elsewhere to drain off the excess gas). This is a so-called shower head. In an embodiment, the shower head comprises at least ten inlets 50. The shower head may be of a cross-sectional area which is large enough to cover the whole or part of the surface of the substrate W. The substrate W may be moved under the shower head 10 as it dries.

In an embodiment, the active drying station ADS is dimensioned to be as long as the substrate table WT so that all objects on the substrate table WT (including the substrate and sensor(s)) can be dried at one time.

Again, in an implementation, filtered gas is used in the shower head 60.

Figure 5:
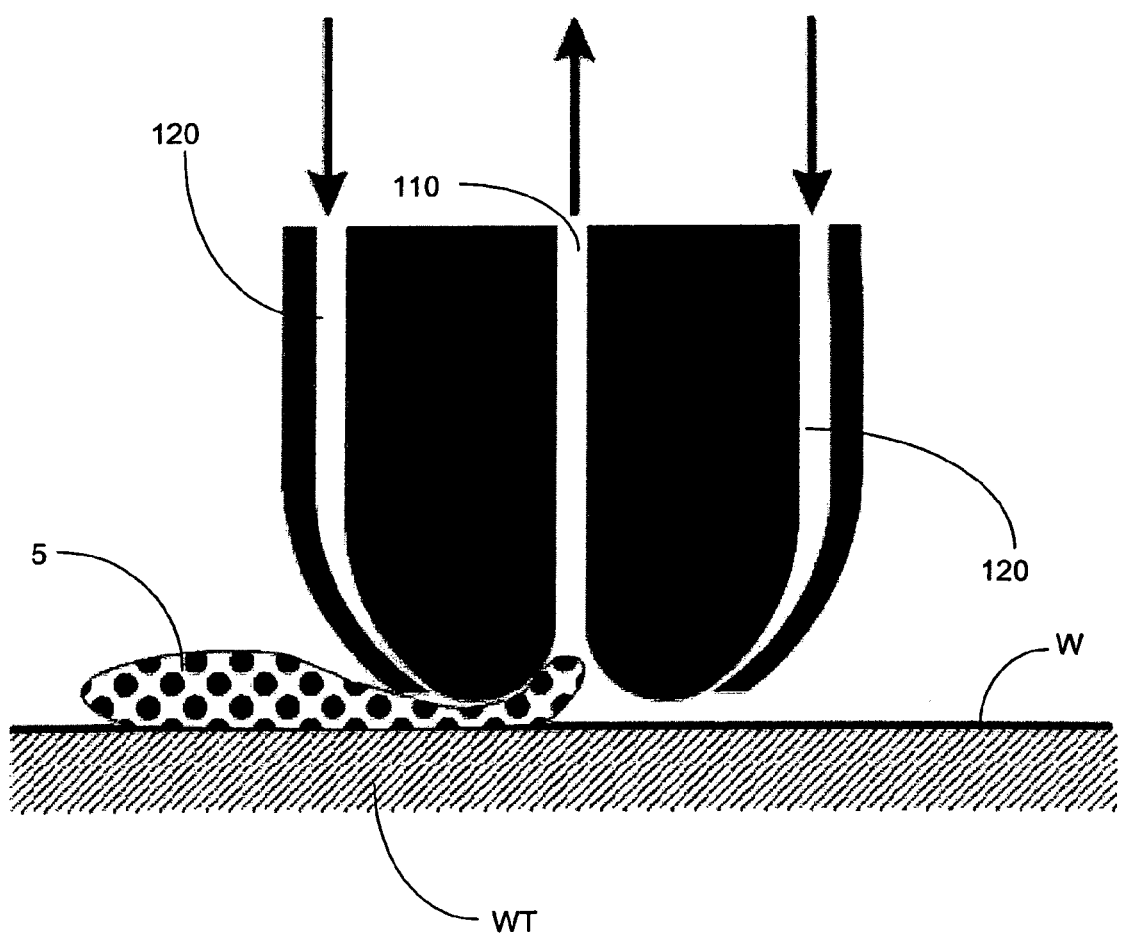
FIG. 5 illustrates, in cross-section, an exemplary embodiment of a gas knife.
Figure 6:
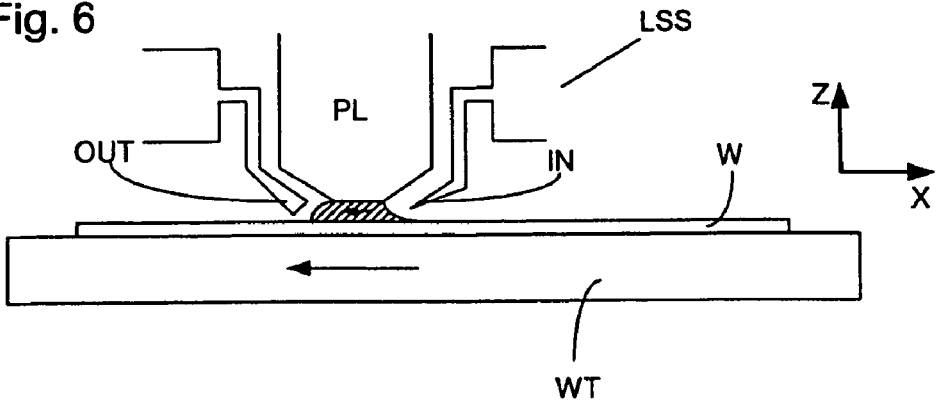
FIG. 6 shows, in cross-section, a liquid supply system in accordance with the present invention.
Figure 7:
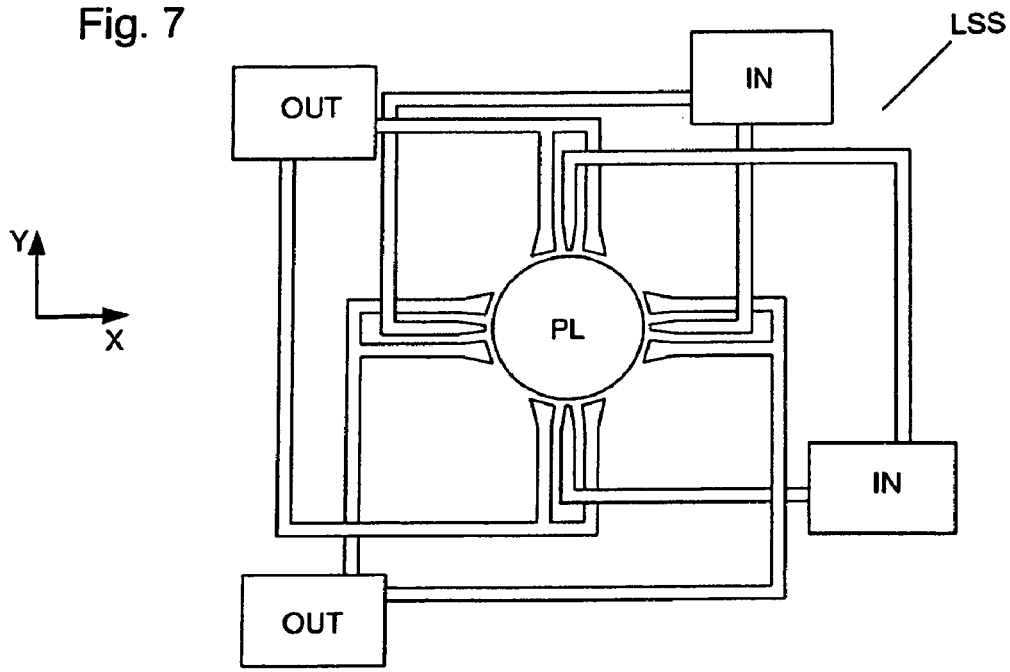
FIG. 7 shows, in plan, the liquid supply system of FIG. 6.

A particularly effective form of gas knife for removing liquid from the substrate W or sensor(s) is shown in FIG. 5. The immersion liquid 5 is sucked up a central passage 110 which is connected to an under pressure. The passage 110 is, in an embodiment, in the form of a slot (extending in and out of the page). Gas is supplied from an outer passage 120 on either, some or all sides of the central passage. The outer passage 120 may also be one or more slots. The outer passage 120 may a single passage that peripherally extends around the central passage 110. Thus, there is a gas flow over the surface of the substrate W which helps draw gas and immersion liquid 5 up into central passage 110. The outer passage may be directed at its outlet at an angle to the surface of the substrate away from perpendicular and towards the inlet of the central passage 110. The bottom surface of the gas knife in which outlet(s) and inlet(s) of the passages 110, 120 are formed may be contoured so that gas flow from the outer passage 120 to the central passage 110 is smooth e.g. by rounding off the edges (i.e. giving a radius to the edges) of the inlet to the central passage 110 and optionally the outlet(s) of the outer passage 120.

In an embodiment, the active drying station ADS is positioned and the path of the substrate table WT chosen such that the substrate table WT moves under the active drying station ADS during the substrate table's normal movement after or before exposure (i.e. no deviation of path way may be required). Thus, through put penalty is minimized.

Figure 4:
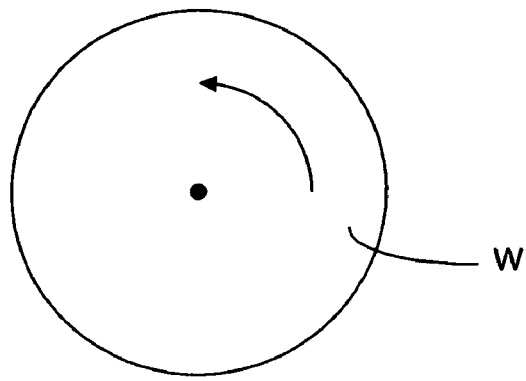
FIG. 4 illustrates schematically the principle of a spinner used in an embodiment of the active drying station.

A further system which may be used in the active drying station ADS is a spinner which is used for spinning the substrate W in the plane of the substrate W around its central point. When the substrate W is spinning (as is illustrated in FIG. 4) centrifugal forces act on the liquid on the surface of the substrate W which is flung outwards where the immersion liquid may be collected.

In an embodiment, the active drying station ADS comprises a liquid retrieval device to recover immersion fluid removed from the object being dried. This is particularly advantageous if the immersion liquid is not water.

In a further embodiment which can be used in combination with any one of the foregoing embodiments, by being positioned before or after the foregoing embodiments, is to use a drying liquid in which the immersion liquid dissolves on the surface of the substrate W. If the drying liquid in which the immersion liquid dissolves is of a type more easily removed from the surface of the substrate than the immersion liquid, this may speed up the drying process. Furthermore, by dissolving the immersion liquid, it may be possible to reduce dissolution of the resist or diffusion into the resist by careful choice of the drying liquid which is used. Thus, an immersion liquid dissolving liquid supply device is provided which can provide drying liquid, in which the immersion liquid dissolves, to the surface of the substrate W. The drying liquid chosen for this task is, in an implementation, more volatile than the immersion liquid such that it can be removed (i.e. evaporated) more easily than the immersion liquid. Alternatively or additionally the liquid may be chosen such that it has a high contact angle with the substrate W so that it beads more easily than the immersion liquid on the substrate W and can therefore be removed. Suitable liquids are ketones or alcohols, in particular IPA (isopropylalchohol).

It will be appreciated that the present invention has been described in relation to the substrate W being dried by the active drying station ADS while in position on the substrate table WT. This is not necessarily the case and other objects such as the substrate table WT itself or sensors on the substrate table WT may be dried by the active drying station. Drying of a sensor on the substrate which may be immersed in an immersion liquid on a surface of the sensor (by accident or for illumination, for example) is advantageous. The performance of the sensors is improved by elimination of liquid during measurements and/or elimination of drying marks. Furthermore, it may be necessary to remove the substrate W from the substrate table WT before being dried by the active drying station ADS, which as stated above, may be positioned outside of the lithographic apparatus. Indeed, even if the active drying station is positioned in the lithographic apparatus, it may be necessary for engineering issues to remove the substrate/object from the substrate table for drying by the active drying station ADS.

Another immersion lithography solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an implementation, the seal is a contactless seal such as a gas seal. Such a system is disclosed in, for example, U.S. patent application Ser. No. 10/705,783, hereby incorporated in its entirety by reference.

Figure 8:
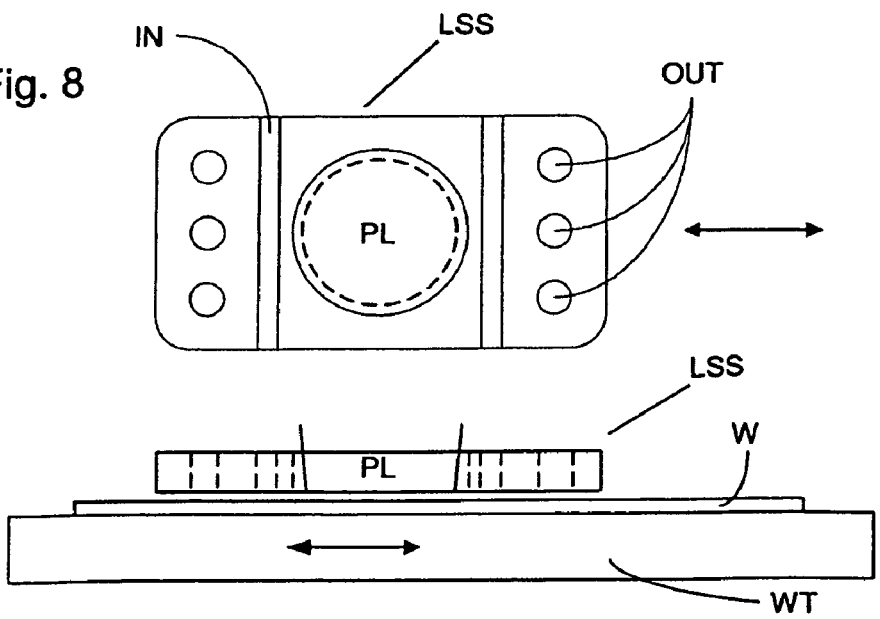
FIG. 8 depicts a liquid supply system according to an embodiment of the invention.

A further immersion lithography solution with a localized liquid supply system is shown in FIG. 8. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application no. 03257072.3, hereby incorporated in its entirety by reference, the idea of a twin or dual stage immersion lithography apparatus is disclosed. Such an apparatus is provided with two substrate tables for supporting the substrate. Leveling measurements are carried out with a substrate table at a first position, without immersion liquid, and exposure is carried out with a substrate table at a second position, where immersion liquid is present. Alternatively, the apparatus can have only one substrate table moving between the first and second positions.

Embodiments of the present invention may be applied to any immersion lithography apparatus and any liquid supply system (including relevant parts thereof), in particular, but not exclusively, to any of those liquid supply systems mentioned above and the bath of liquid as described above.

While specific embodiments of the invention have been described above, it will be appreciated that the invention may be practiced otherwise than as described. The description is not intended to limit the invention.

The invention claimed is:

1. A lithographic apparatus comprising:
   a support structure configured to hold a patterning device, the patterning device configured to impart a beam of radiation with a pattern in its cross-section to form a patterned beam;
   a substrate table configured to hold a substrate;
   a projection system adapted to project the patterned beam onto a target portion of the substrate;
   a liquid supply system configured to at least partly fill a space between the projection system and an object on the substrate table with a liquid; and
   an active drying station configured to actively remove the liquid from the object, or the substrate table, or both, by providing a flow of gas over a corresponding surface of the object, or the substrate table, or both, wherein the active drying station comprises a gas inlet that forms a gas knife, the gas knife configured to provide the flow of gas onto the corresponding surface of the object, substrate table, or both, and wherein the substrate table is configured to transport the object to the active drying station.

2. An apparatus according to claim 1, wherein the substrate table is configured to support the object during active removal of liquid from the object by the active drying station.

3. An apparatus according to claim 1, wherein the gas knife further comprises a further gas inlet and a gas outlet positioned between the gas inlets.

4. An apparatus according to claim 1, further comprising a gas outlet to remove gas from the surface of the object, substrate table, or both, the gas inlet substantially surrounding the periphery of the gas outlet.

5. An apparatus according to claim 1, further comprising a gas shower with at least ten inlets, the gas shower configured to provide a flow of gas over the corresponding surface of the object, or the substrate table, or both.

6. An apparatus according to claim 1, wherein the liquid is a first liquid and the active drying station comprises a first liquid dissolving liquid supply device configured to provide a second liquid, in which the first liquid dissolves, to a surface of the object, or the substrate table, or both.

7. An apparatus according to claim 6, wherein the second liquid is more volatile than the first liquid.

8. An apparatus according to claim 6, wherein the second liquid comprises a ketone or an alcohol.

9. An apparatus according to claim 1, wherein the active drying station comprises a gas outlet configured to remove gas, liquid, or both from the surface of the object, substrate table, or both.

10. An apparatus according to claim 1, wherein the active drying station comprises a spinner configured to spin the object, substrate table, or both.

11. An apparatus according to claim 1, wherein the object comprises a substrate.

12. An apparatus according to claim 1, wherein the object comprises a sensor.

13. An apparatus according to claim 1, wherein the active drying station is configured to remove the liquid from the object, or the substrate table, or both when the object, or the substrate table, or both, is/are substantially removed from under the liquid supply system, the projection system or both.

14. An apparatus according to claim 1, wherein the active drying station is positioned in the lithographic apparatus.

15. An apparatus according to claim 1, wherein the active drying station is positioned such that the object, substrate table, or both, is dried within a predetermined amount of time after exposure.

16. An apparatus according to claim 15, wherein the predetermined amount of time is less than approximately 1 second.

17. An apparatus according to claim 1, wherein the liquid is removed by the active drying station from under the liquid supply system, the projection system, or both.

18. A device manufacturing method comprising:
    providing a liquid between a projection system and an object on the substrate table using a liquid supply system;
    projecting a patterned beam of radiation, through the liquid, onto a target portion of a substrate using the projection system; and
    actively removing the liquid from the object, or the substrate table, or both using an active drying station,
    wherein the removing includes providing a flow of gas with a gas knife over a surface of the object, or the substrate table, or both, and
    transporting the object to the active drying station using the substrate table.

19. A method according to claim 18, wherein the providing includes providing gas at two positions and removing the gas from a position between the two positions.

20. A method according to claim 18, further comprising removing gas from the surface of the object, substrate table, or both at a position substantially surrounding a periphery of a position where the gas is provided.

21. A method according to claim 18, comprising providing the gas using a gas shower with at least ten inlets.

22. A method according to claim 18, comprising removing gas, liquid, or both from the surface of the object, substrate table, or both.

23. A method according to claim 18, comprising spinning the object, substrate table, or both.

24. A method according to claim 18, wherein the object comprises a substrate.

25. A method according to claim 18, wherein the removing includes actively removing the liquid from the object, or the substrate table, or both, when the object, or the substrate table, or both, is/are substantially removed from under a liquid supply system that provides the liquid, the projection system or both.

26. A method according to claim 18, wherein the actively removing the liquid includes providing the flow of gas within a predetermined amount of time after exposure.

27. A method according to claim 26, wherein the predetermined amount of time is less than approximately 1 second.

28. A method according to claim 18, wherein the liquid is removed by the active drying station from under the liquid supply system, the projection system, or both.

29. A lithographic apparatus comprising:
    a support structure configured to hold a patterning device, the patterning device configured to impart a beam of radiation with a pattern in its cross-section to form a patterned beam;
    a substrate table configured to hold a substrate;
    a projection system adapted to project the patterned beam onto a target portion of the substrate;
    a liquid supply system configured to at least partly fill a space between the projection system and an object on the substrate table with a liquid; and
    an active drying station configured to remove the liquid from the object, or the substrate table, or both,
    wherein the substrate table is configured to support the object during removal of liquid from the object by the active drying station, and
    wherein the substrate table is configured to transport the object to the active drying station.

30. An apparatus according to claim 29, wherein the active drying station comprises a gas inlet configured to provide gas onto a surface of the object, substrate table, or both.

31. An apparatus according to claim 30, further comprising a gas outlet to remove gas from the surface of the object, substrate table, or both, the gas inlet substantially surrounding the periphery of the gas outlet.

32. An apparatus according to claim 29, wherein the liquid is a first liquid and the active drying station comprises a first liquid dissolving liquid supply device configured to provide a second liquid, in which the first liquid dissolves, to a surface of the object, or the substrate table, or both.

33. An apparatus according to claim 29, wherein the active drying station comprises a spinner configured to spin the object, substrate table, or both.

34. An apparatus according to claim 29, wherein the active drying station is positioned in the lithographic apparatus.

35. An apparatus according to claim 29, wherein the active drying station is positioned such that the object, or the substrate table, or both, is dried within a predetermined amount of time after exposure.

36. An apparatus according to claim 35, wherein the predetermined amount of time is less than approximately 1 second.

37. An apparatus according to claim 29, wherein the liquid is removed by the active drying station from under the liquid supply system, the projection system, or both.

* * * * *

UNITED STATES PATENT AND TRADEMARK OFFICE
CERTIFICATE OF CORRECTION

PATENT NO. : 7,616,383 B2  Page 1 of 1
APPLICATION NO. : 10/847661
DATED : November 10, 2009
INVENTOR(S) : Bob Streefkerk et al.

It is certified that error appears in the above-identified patent and that said Letters Patent is hereby corrected as shown below:

On title page, item (56) References Cited
replace "DE 206 207"
with --DE 206 607--.

On title page, item (56) References Cited
replace "WO 11-283903"
with --JP 11-283903--.

On title page, item (56) References Cited
replace "WO 2005/006028"
with --WO 2005/006026--.

On title page, item (56) References Cited
replace "WO 2005/059817"
with--WO2005/059617--.

On title page, item (56) References Cited
replace "G. Owen et al., '1/$\mu$m Optical Lithography', J. Vac. Sci. Technol. B., vol. 10, No, 6, Nov./Dec. 1992, pp. 3032-3036"
with --G. Owen et al., '1/8$\mu$m Optical Lithography', J. Vac. Sci. Technol. B., vol. 10, No. 6, Nov./Dec. 1992, pp. 3032-3036--.

On title page, item (56) References Cited
Please add the following foreign reference as cited in the IDS filed January 10, 2005
--WO 2004/019128, published 03/2004--.

Signed and Sealed this

Twenty-sixth Day of January, 2010

David J. Kappos
*Director of the United States Patent and Trademark Office*